(12) United States Patent
Yasuda

(10) Patent No.: US 10,439,586 B2
(45) Date of Patent: Oct. 8, 2019

(54) ELECTRONIC MODULE HAVING A FILLER IN A SEALING RESIN

(71) Applicant: Murata Manufacturing Co., Ltd., Nagaokakyo-shi, Kyoto-fu (JP)

(72) Inventor: Junpei Yasuda, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/029,684

(22) Filed: Jul. 9, 2018

(65) Prior Publication Data

US 2019/0028083 A1 Jan. 24, 2019

(30) Foreign Application Priority Data

Jul. 19, 2017 (JP) .................. 2017-139540
Apr. 21, 2018 (JP) .................. 2018-081929

(51) Int. Cl.
*H03H 9/02* (2006.01)
*H01L 25/16* (2006.01)
(Continued)

(52) U.S. Cl.
CPC ....... *H03H 9/02984* (2013.01); *H01L 21/563* (2013.01); *H01L 23/295* (2013.01); *H01L 23/3121* (2013.01); *H01L 23/5389* (2013.01); *H01L 24/73* (2013.01); *H01L 25/16* (2013.01); *H01L 25/50* (2013.01); *H03H 3/08* (2013.01); *H03H 9/02913* (2013.01); *H03H 9/02937* (2013.01); *H03H 9/059* (2013.01); *H03H 9/0542* (2013.01); *H03H 9/0552* (2013.01);

*H03H 9/1071* (2013.01); *H03H 9/1092* (2013.01); *H03H 9/25* (2013.01);
(Continued)

(58) Field of Classification Search
CPC ..... H01L 2924/181; H01L 2924/19106; H01L 2924/19105; H01L 2824/381
See application file for complete search history.

(56) References Cited

U.S. PATENT DOCUMENTS

| 2012/0018906 A1 | 1/2012 | Mino et al. |
| 2013/0057361 A1 | 3/2013 | Sakano et al. |

(Continued)

FOREIGN PATENT DOCUMENTS

| JP | 2006-74587 A | 3/2006 |
| JP | 2012-28510 A | 2/2012 |

(Continued)

*Primary Examiner* — Hoai V Pham
(74) *Attorney, Agent, or Firm* — Keating & Bennett, LLP

(57) ABSTRACT

An electronic module includes a substrate, at least one first electronic component that includes a hollow portion, at least one second electronic component that includes no hollow portion, a first sealing resin, and a second sealing resin. The at least one first electronic component is sealed with the first sealing resin. The at least one second electronic component has a narrowest pitch between the electrodes that are provided on the mounting surface, and at least the mounting surface including the electrodes of the at least one second electronic component are sealed with the second sealing resin. The volume percentage of a filler that is included in the first sealing resin is larger than the volume percentage of a filler that is included in the second sealing resin.

16 Claims, 9 Drawing Sheets

(51) Int. Cl.
*H01L 21/56* (2006.01)
*H01L 23/29* (2006.01)
*H01L 23/31* (2006.01)
*H01L 23/538* (2006.01)
*H01L 23/00* (2006.01)
*H03H 9/05* (2006.01)
*H03H 9/10* (2006.01)
*H03H 9/25* (2006.01)
*H03H 3/08* (2006.01)
*H01L 25/00* (2006.01)
*H01L 23/552* (2006.01)

(52) U.S. Cl.
CPC ............ *H01L 23/552* (2013.01); *H01L 24/13* (2013.01); *H01L 24/16* (2013.01); *H01L 24/81* (2013.01); *H01L 2224/13101* (2013.01); *H01L 2224/73204* (2013.01); *H01L 2224/8185* (2013.01); *H01L 2224/81801* (2013.01); *H01L 2224/81815* (2013.01); *H01L 2924/16235* (2013.01); *H01L 2924/181* (2013.01); *H01L 2924/19105* (2013.01); *H01L 2924/19106* (2013.01); *H01L 2924/381* (2013.01)

(56) References Cited

U.S. PATENT DOCUMENTS

2016/0277003 A1  9/2016  Kikuchi et al.
2018/0138155 A1* 5/2018  Kim ................... H01L 23/552

FOREIGN PATENT DOCUMENTS

| WO | 2011/138877 A1 | 11/2011 |
| WO | 2014/017159 A1 | 1/2014 |
| WO | 2015/098678 A1 | 7/2015 |

* cited by examiner

1100

1200

ELECTRONIC MODULE HAVING A FILLER IN A SEALING RESIN

CROSS REFERENCE TO RELATED APPLICATIONS

This application claims the benefit of priority to Japanese Patent Application No. 2017-139540 filed on Jul. 19, 2017 and Japanese Patent Application No. 2018-081929 filed on Apr. 21, 2018. The entire contents of these applications are hereby incorporated herein by reference.

BACKGROUND OF THE INVENTION

1. Field of the Invention

The present invention relates to an electronic module including electronic components that are mounted on a substrate and that are sealed with a sealing resin, and a method for manufacturing the electronic module.

2. Description of the Related Art

Electronic modules including electronic components that are mounted on a substrate and that are sealed with a sealing resin are widely used for various electronic devices. FIG. 9 illustrates an electronic module 1100 that is disclosed in International Publication No. WO2014/017159A1, as an example.

The electronic module 1100 includes electronic components (chip components) 102, 103, and 104 in the form of a chip, and each electronic component is obtained by forming electrodes at both ends of a capacitor, an inductor, or a resistor, for example, and is mounted on one main surface of a substrate (wiring substrate) 101. A semiconductor device (semiconductor substrate) 105 is mounted on the other main surface of the substrate 101, and electrodes are formed on a mounting surface of the semiconductor device 105.

The electronic components 102, 103, and 104 are sealed with a sealing resin (resin layer) 108. The semiconductor device 105 is sealed with a sealing resin 109.

The sealing resin 108 and the sealing resin 109 that are the same kind of resin are formed on the one main surface and the other main surface of the substrate (wiring substrate) 101 of the electronic module 1100. According to the disclosure, the sealing resin 108 and the sealing resin 109 may have different coefficients of linear expansion to prevent a warp of the electronic module 1100 when the electronic module 1100 greatly warps.

Elastic wave devices that use a SAW (Surface Acoustic Wave) or a BAW (Bulk Acoustic Wave) are widely used as resonators or filters of electronic devices, such as mobile communication devices. FIG. 10 illustrates an elastic wave device 1200 that is disclosed in International Publication No. WO2015/098678A1, as an example.

The elastic wave device 1200 includes a hollow portion 204 that is surrounded by components, such as a substrate (support substrate) 201, support members 202, and a lid 203.

In the elastic wave device 1200, a piezoelectric thin film 205 is formed in the hollow portion 204, and interdigital transducer electrodes 206 are formed on the piezoelectric thin film 205. The hollow portion 204 is formed so that the interdigital transducer electrodes 206 are not hindered from vibrating.

The electronic module 1100 includes the semiconductor device 105 and the electronic components 102, 103, and 104 in the form of a chip, such as a capacitor, an inductor, or a resistor. In some cases, the electronic module 1100 preferably includes an additional electronic component including a hollow portion as in the elastic wave device 1200 to increase functionality.

However, when a semiconductor device including electrodes that are formed on the mounting surface with very narrow pitches interposed between the electrodes and an electronic component including a hollow portion are sealed with sealing resins having the same liquidity, the following problem occurs.

In the semiconductor device, which includes the electrodes that are formed on the mounting surface, the pitches between the electrodes are typically very narrow. Accordingly, the use of a resin that has high liquidity is required to seal the semiconductor device. There is a risk that the use of a sealing resin that has low liquidity causes the formation of a gap in one of spaces between the electrodes on the mounting surface of the semiconductor device because the spaces are not sufficiently filled with the sealing resin. When the electronic module is mounted on, for example, a substrate of an electronic device by, for example, reflow soldering, solder that is used to mount the semiconductor device on the substrate is melted again due to heat, expands, and enters the gap that is formed in the sealing resin between the electrodes of the semiconductor device. Consequently, there is a risk that a short circuit between the electrodes of the semiconductor device occurs, that is, a phenomenon called a solder flash occurs.

The use of a material having low liquidity is required to seal the electronic component including the hollow portion as in the elastic wave device 1200. There is a risk that the use of a sealing resin that has high liquidity causes the hollow portion to be crushed due to the pressure of the sealing resin when the sealing resin is formed around the electronic component including the hollow portion.

In many cases, the sealing resin includes an additional inorganic filler, such as silica, so that the coefficient of linear expansion is adjusted. The included filler typically decreases the liquidity of the sealing resin. The filler blocks a passage through which water passes in the sealing resin. The humidity resistance of the sealing resin typically increases as the amount of the filler increases. The liquidity increases as the average particle diameter of the filler decreases, and the liquidity decreases as the average particle diameter of the filler increases, provided that the sealing resin includes the same amount (the same volume) of the filler.

The required liquidity of the sealing resin differs between the electronic components that are included as described above. Accordingly, when the semiconductor device having the narrow pitches between the electrodes and the electronic component including the hollow portion are mounted on the substrate of the electronic module and are sealed with the sealing resins having the same liquidity, there are the following problems.

In the case in which the sealing resin that has high liquidity is used to sufficiently fill, with the sealing resin, the spaces between the electrodes of the electronic component (semiconductor device) having the narrow pitches between the electrodes and to prevent a gap from being formed in the sealing resin between the electrodes, there is a risk that the hollow portion of the electronic component (elastic wave device) including the hollow portion is crushed by the pressure when the sealing resin is filled.

In the case in which the sealing resin that has low liquidity is used to prevent the hollow portion of the electronic component including the hollow portion from being crushed due to the pressure when the sealing resin is filled, the spaces between the electrodes of the electronic component having the narrow pitches between the electrodes are not sufficiently filled with the sealing resin, and there is a risk that a gap is formed in the sealing resin between the electrodes and causes the solder flash.

SUMMARY OF THE INVENTION

Preferred embodiments of the present invention provide electronic modules each including electronic components that are mounted on a substrate and that are sealed with a sealing resin, and methods for manufacturing the electronic modules.

According to a preferred embodiment of the present invention, an electronic module includes a substrate, at least one first electronic component that includes electrodes provided on a mounting surface thereof on the substrate and that includes a hollow portion, at least one second electronic component that includes electrodes provided on a mounting surface thereof on the substrate and that includes no hollow portion, a first sealing resin, and a second sealing resin. The at least one first electronic component is sealed with the first sealing resin. The at least one second electronic component has a narrowest pitch between the electrodes that are provided on the mounting surface, and at least the mounting surface including the electrodes of the at least one second electronic component are sealed with the second sealing resin. A volume percentage of a filler that is included in the first sealing resin is larger than a volume percentage of a filler that is included in the second sealing resin. Even when no filler is included in the second sealing resin, it is satisfied that "a volume percentage of a filler that is included in the first sealing resin is larger than a volume percentage of a filler that is included in the second sealing resin".

According to a preferred embodiment of the present invention, an electronic module includes a substrate, at least one first electronic component that includes electrodes provided on a mounting surface thereof on the substrate and that includes a hollow portion, at least one second electronic component that includes electrodes provided on a mounting surface thereof on the substrate and that includes no hollow portion, a first sealing resin, and a second sealing resin. The at least one first electronic component is sealed with the first sealing resin. The at least one second electronic component has a narrowest pitch between the electrodes that are provided on the mounting surface, and at least the mounting surface including the electrodes of the at least one second electronic component are sealed with the second sealing resin. An average particle diameter of a filler that is included in the first sealing resin is larger than an average particle diameter of a filler that is included in the second sealing resin. Even when no filler is included in the second sealing resin, it is satisfied that "an average particle diameter of a filler that is included in the first sealing resin is larger than an average particle diameter of a filler that is included in the second sealing resin".

The average particle diameter of the filler that is included in each resin is measured by the following method. A section of the resin that includes the filler is exposed. Subsequently, a square portion of the exposed section in which the number of the particles of the filler is no less than about 100 and less than about 110 is determined to be a "region to be measured", and a first SEM (scanning electron microscope) image (backscattered electron image) is captured. Subsequently, at a depth of about 3 μm therefrom, a section in the region to be measured is exposed, and a second SEM image is captured. These processes are repeated, and third, fourth, . . . n-th SEM images are captured in the region to be measured. Subsequently, 10 particles of the filler existing apart from each other as far as possible are selected, as particles of the filler to be measured, from the particles of the filler in the region to be measured. Subsequently, a particle of the filler having the largest sectional area is selected from the particles of the filler to be measured in the SEM images that are captured, this area is regarded as a presumptive maximum sectional area of the particles of the filler to be measured (presumptive maximum sectional areas of 10 particles of the filler to be measured are obtained). The diameters of the particles are calculated from the presumptive maximum sectional areas of the particles of the filler to be measured with the particles of the filler to be measured assumed to be perfect spheres. The calculated diameters are determined to be presumptive particle diameters of the particles of the filler to be measured. The average value of the presumptive particle diameters of 10 particles of the filler to be measured is calculated and determined to be the average particle diameter of the filler that is included in the resin.

Humidity resistance of the first sealing resin is preferably higher than humidity resistance of the second sealing resin. In this case, the first sealing resin that has high humidity resistance prevents water from entering the hollow portion of the at least one first electronic component.

According to a preferred embodiment of the present invention, the first sealing resin may be provided on one main surface of the substrate, and the second sealing resin may be provided on the other main surface of the substrate. Alternatively, according to a preferred embodiment of the present invention, the first sealing resin and the second sealing resin may be stacked on one main surface of the substrate.

An example of the at least one first electronic component is an elastic wave device that uses, for example, a SAW or a BAW. An example of the at least one second electronic component that has the narrowest pitch between the electrodes that are provided on the mounting surface is a semiconductor device.

The electronic module preferably includes a mounting outer electrode. The outer electrode is preferably provided on an outer surface of the second sealing resin. The reason is as follows. Water is likely to enter the inside of the electronic module from a location at which the outer electrode is provided on the sealing resin. However, in the case in which the at least one first electronic component is sealed with the first sealing resin, and the outer electrode is provided on the second sealing resin, even when water enters the inside from the location at which the outer electrode is provided on the second sealing resin, the first sealing resin and the substrate prevent the water that has entered the inside from reaching the hollow portion of the at least one first electronic component.

A shield electrode is preferably provided on at least a portion of an outer surface of the first sealing resin and an outer surface of the second sealing resin. The reason is as follows. The shield electrode prevents a noise from entering the inside of the electronic module from the outside and prevents a noise from being emitted from the inside of the electronic module to the outside. The shield electrode also prevents water from entering the inside and accordingly enables the humidity resistance of the electronic module to be further improved.

According to a preferred embodiment of the present invention, a method of manufacturing an electronic module includes preparing a substrate, at least one first electronic component that includes electrodes provided on a mounting surface thereof on the substrate and that includes a hollow portion, at least one second electronic component that includes electrodes provided on a mounting surface thereof on the substrate and that includes no hollow portion, a first sealing resin that is uncured, and a second sealing resin that is uncured and that has liquidity higher than liquidity of the first sealing resin that is uncured, mounting the at least one first electronic component directly or indirectly on the substrate, mounting the at least one second electronic component directly or indirectly on the substrate, filling a space around the at least one first electronic component that is mounted with the first sealing resin that is uncured and curing the first sealing resin that is uncured, and filling, with the second sealing resin that is uncured, at least a space on the mounting surface including the electrodes of the at least one second electronic component that has a narrowest pitch between the electrodes that are provided on the mounting surface and curing the second sealing resin that is uncured.

According to a preferred embodiment of the present invention, a method of manufacturing an electronic module includes preparing a substrate, at least one first electronic component that includes electrodes provided on a mounting surface thereof on the substrate and that includes a hollow portion, at least one second electronic component that includes electrodes provided on a mounting surface thereof on the substrate and that includes no hollow portion, a first sealing resin that is uncured, and a second sealing resin that is uncured and that, when the second sealing resin is cured, has humidity resistance lower than humidity resistance of the first sealing resin when the first sealing resin is cured, mounting the at least one first electronic component directly or indirectly on the substrate, mounting the at least one second electronic component directly or indirectly on the substrate, filling a space around the at least one first electronic component that is mounted with the first sealing resin that is uncured and curing the first sealing resin that is uncured, and filling, with the second sealing resin that is uncured, at least a space on the mounting surface including the electrodes of the at least one second electronic component that has a narrowest pitch between the electrodes that are formed on the mounting surface and curing the second sealing resin that is uncured.

According to a preferred embodiment of the present invention, the electronic module is structured such that the at least one first electronic component is sealed with the first sealing resin, the at least one second electronic component has the narrowest pitch between the electrodes that are provided on the mounting surface, and at least the mounting surface and the electrodes of the at least one second electronic component are sealed with the second sealing resin. The volume percentage of the filler that is included in the first sealing resin is larger than the volume percentage of the filler that is included in the second sealing resin. Since the second sealing resin has high liquidity when uncured, at least a space around the mounting surface and the electrodes of the at least one second electronic component is sufficiently filled with the second sealing resin, and a gap is unlikely to be provided in the sealing resin between the electrodes of the at least one second electronic component. In addition, since the first sealing resin has low liquidity when uncured, the hollow portion of the at least one first electronic component is unlikely to be crushed due to the pressure when the first sealing resin is filled.

According to a preferred embodiment of the present invention, the electronic module is structured such that the at least one first electronic component is sealed with the first sealing resin, the at least one second electronic component has the narrowest pitch between the electrodes that are provided on the mounting surface, and at least the mounting surface and the electrodes of the at least one second electronic component are sealed with the second sealing resin. The average particle diameter of the filler that is included in the first sealing resin is larger than the average particle diameter of the filler that is included in the second sealing resin. Since the second sealing resin has high liquidity when uncured, at least a space around the mounting surface and the electrodes of the at least one second electronic component is sufficiently filled with the second sealing resin, and a gap is unlikely to be provided in the sealing resin between the electrodes of the at least one second electronic component. In addition, since the first sealing resin has low liquidity when uncured, the hollow portion of the at least one first electronic component is unlikely to be crushed due to the pressure when the first sealing resin is filled.

The methods according to preferred embodiments enable the electronic modules according to preferred embodiments of the present invention to be readily manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
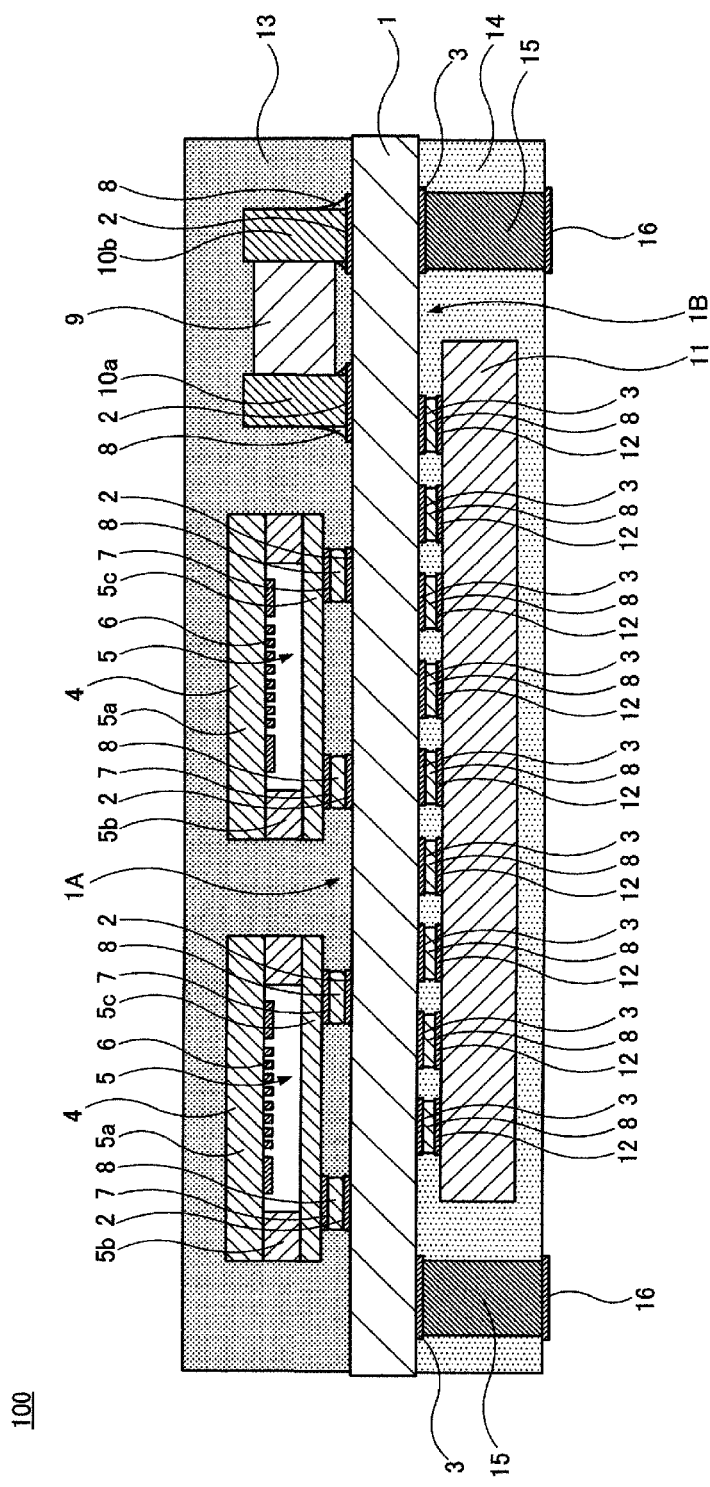
FIG. 1 is a sectional view of an electronic module according to a first preferred embodiment of the present invention.

Preferred embodiments of the present invention will hereinafter be described with reference to the drawings. The preferred embodiments will be described by way of example as preferred embodiments of the present invention, and the present invention is not limited to the preferred embodiments. The contents described according to the preferred embodiments may be combined. In this case, these contents are included in the present invention. The drawings assist in understanding the preferred embodiments and are schematically illustrated in some cases. In some cases, the ratio of dimensions of a component or between components in the drawings does not match the ratio of the dimensions thereof in the description. In some cases, a component in the description is omitted in the drawings, and the number thereof is omitted in the drawings.

First Preferred Embodiment

FIG. 1 illustrates an electronic module 100 according to a first preferred embodiment of the present invention. FIG. 1 is a sectional view of the electronic module 100.

The electronic module 100 includes a substrate 1. The material of the substrate 1 is not limited. For example, a resin substrate that is made of, for example, PCB (Poly Chlorinated Biphenyl) or a ceramics substrate that is made of, for example, LTCC (Low Temperature Co-Fired Ceramics) may preferably be used. The structure of the substrate 1 is not limited, and the substrate may be a multilayer substrate or a single-layer substrate.

The substrate 1 includes a first main surface 1A on the upper side in FIG. 1 and includes a second main surface 1B on the lower side in FIG. 1. Electrodes 2 are provided on the first main surface 1A. Electrodes 3 are provided on the second main surface 1B. The materials of the electrodes 2 and 3 are not limited, and preferred examples thereof include copper and silver. The surfaces of the electrodes 2 and 3 are plated with tin or solder in some cases.

In the substrate 1, via electrodes, or via electrodes and wiring electrodes are preferably made of, for example, copper to provide inner wiring although this is not illustrated. The inner wiring connects the electrodes 2 provided on the first main surface 1A of the substrate 1 and the electrodes 3 provided on the second main surface 1B to each other.

Two first electronic components 4 each of which includes a hollow portion 5 are mounted on the first main surface 1A of the substrate 1. According to the present preferred embodiment, each first electronic component 4 is preferably an elastic wave device that uses a SAW, for example. However, the specific type of each first electronic component 4 is not limited, and may be an elastic wave device that uses a BAW, instead of the elastic wave device that use a SAW, or may be an electronic component other than the elastic wave devices.

Each first electronic component 4 includes the hollow portion 5 that is defined by a piezoelectric substrate 5a, a support member 5b, and a lid 5c. Interdigital transducer electrodes 6 are provided on the piezoelectric substrate 5a in the hollow portion 5. The hollow portion 5 of each first electronic component 4 is structured so that the interdigital transducer electrodes 6 are not hindered from vibrating. In the description, the hollow portion is a closed space that is intentionally provided and does not correspond to, for example, a gap that is unintentionally produced by air that has entered resin in a manufacturing process. In some cases, the hollow portion 5 of each first electronic component 4 is liquid-tight but is not completely air tight, and it is necessary to improve humidity resistance by using a sealing resin, which keeps air having high humidity from entering the hollow portion.

Each first electronic component 4 includes electrodes 7 that are provided on a mounting surface. The material of each electrode 7 is not limited, and preferred examples thereof include Cu and Ni. The pitches between the electrodes 7 are sufficiently wide. The pitch between the electrodes 7 that are closest to each other is preferably, for example, about 0.3 mm. The electrodes 7 may not be electrodes that are made of a metal film, but may be bump electrodes, such as gold bumps, for example.

The electrodes 7 that are provided on the mounting surfaces of the first electronic components 4 are joined to the electrodes 2 that are provided on the first main surface 1A of the substrate 1 preferably using solder 8, for example. The electrodes 7 and the electrodes 2 may be joined to each other using a conductive adhesive, instead of the solder 8. According to the present preferred embodiment, the two first electronic components 4 are mounted on the first main surface 1A of the substrate 1. The first electronic components 4 may be mounted directly or indirectly on the substrate 1. The phrase "to be mounted indirectly on the substrate" means that a sealing resin is applied to the substrate and the first electronic components are mounted on the sealing resin.

A second electronic component 9 defined by a chip component includes no hollow portion and is mounted on the first main surface 1A of the substrate 1. Examples of the second electronic component 9 include a capacitor, an inductor, and a resistor. Electrodes 10a and 10b are provided at both ends of the second electronic component 9. The pitch between the electrodes 10a and 10b is sufficiently wide and is preferably, for example, about 0.3 mm.

The electrodes 10a and 10b of the second electronic component 9 are joined to the electrodes 2 that are provided on the first main surface 1A of the substrate 1 preferably using the solder 8, for example. The electrodes 10a and 10b and the electrodes 2 may be joined to each other by using a conductive adhesive, instead of the solder 8. The second electronic component 9 includes no electrodes that are provided on the mounting surface and thus has no pitch between electrodes that are provided on the mounting surface (does not corresponds to a "second electronic component that has the narrowest pitch between the electrodes that are provided on the mounting surface").

A second electronic component 11 that includes no hollow portion is mounted on the second main surface 1B of the substrate 1. According to the present preferred embodiment, the second electronic component 11 is preferably a semiconductor device, for example.

Electrodes 12 are provided on the mounting surface of the second electronic component 11. The material of each electrode 12 is not limited, and preferred examples thereof include Cu. The pitches between the electrodes 12 that are provided on the mounting surface of the second electronic component 11 are narrower than the pitches between the electrodes that are provided on the mounting surface of the other second electronic component. The pitch between the electrodes 12 that are closest to each other is preferably, for example, about 150 μm. The electrodes 12 may not be electrodes that are made of a metal film, but may be bump electrodes, such as gold-bumps, for example.

The electrodes 12 that are provided on the mounting surface of the second electronic component 11 are joined to the electrodes 3 that are provided on the second main surface 1B of the substrate 1 preferably using the solder 8, for example. The electrodes 12 and the electrodes 3 may be joined to each other by using a conductive adhesive, instead of the solder 8. The second electronic component 11 may be mounted directly or indirectly on the substrate 1. The phrase "to be mounted indirectly on the substrate" means that a sealing resin is applied to the substrate and the second electronic component is mounted on the sealing resin.

The first electronic components 4 and the second electronic component 9 defined by chip components that are mounted on the first main surface 1A of the substrate 1 are sealed with a first sealing resin 13.

A resin that has low liquidity when uncured and high humidity resistance when cured is used as the first sealing resin 13. The reason why the resin that has low liquidity when uncured is used as the first sealing resin 13 is to prevent the hollow portion 5 of each first electronic component 4 from being crushed due to the pressure of the first sealing resin 13 when the first sealing resin 13 is provided. The reason why the resin that has high humidity resistance when cured is used as the first sealing resin 13 is to prevent water from entering the hollow portion 5 of each first electronic component 4 that is sealed with the first sealing resin 13.

According to the present preferred embodiment, the first sealing resin 13 is preferably, for example, an epoxy resin, as a base material, that includes powder of silica having an average particle diameter of about 30 μm in an amount of about 80% by volume as a filler. The epoxy resin, which is the base material, is preferably thermosetting, photocurable, or thermosetting and photocurable, for example. The first sealing resin 13 has low liquidity when uncured and high humidity resistance when cured because of a large amount of the included filler. The type of the base material of the first sealing resin 13 is not limited, and the base material may be a silicone resin or an acrylic resin, instead of an epoxy resin, for example. The material of the filler is not limited and may be alumina, boron nitride, or a composite material thereof, instead of silica, for example.

The second electronic component 11 that is mounted on the second main surface 1B of the substrate 1 is sealed with a second sealing resin 14.

A resin that has high liquidity when uncured is used as the second sealing resin 14. The reason why the resin that has high liquidity when uncured is used as the second sealing resin 14 is to sufficiently fill the spaces between the electrodes 12 of the second electronic component 11 having narrow pitches with the second sealing resin 14 to prevent a gap from being formed in the second sealing resin 14 between the electrodes 12.

According to the present preferred embodiment, the second sealing resin 14 is preferably an epoxy resin, as a base material, that includes powder of silica having an average particle diameter of about 30 μm in an amount of about 50% by volume as a filler, for example. The epoxy resin, which is the base material, is preferably thermosetting, photocurable, or thermosetting and photocurable, for example. The second sealing resin 14 has high liquidity when uncured because of a small amount of the included filler. The humidity resistance of the second sealing resin 14 is lower than that of the first sealing resin 13 because the second sealing resin 14 includes a small amount of the filler. The type of the base material of the second sealing resin 14 is not limited, and the base material may be a silicone resin or an acrylic resin, instead of an epoxy resin, for example. The material of the filler is not limited and may be alumina, boron nitride, or a composite material thereof, instead of silica, for example. The second sealing resin 14 may not include the filler and may be a fillerless resin although the second sealing resin 14 includes the filler according to the present preferred embodiment.

Via electrodes 15 extend through the second sealing resin 14. The material of each via electrode 15 is not limited, and preferred examples thereof include copper. Each via electrode 15 is connected at one end to the corresponding electrode 3 that is provided on the second main surface 1B of the substrate 1. The other end of each via electrode 15 is exposed from the outer surface of the second sealing resin 14. For example, the other end of each via electrode 15 that is exposed from the outer surface of the second sealing resin 14 is preferably gold-plated to define a corresponding one of outer electrodes 16 that are used when the electronic module 100 is mounted.

Since the first sealing resin 13 has low liquidity when uncured, the electronic module 100 having the above structure prevents the hollow portion 5 of each first electronic component 4 from being crushed due to the pressure when the first sealing resin 13 is filled. Since the first sealing resin 13 has high humidity resistance, the electronic module 100 prevents water from entering the hollow portion 5 of each first electronic component 4. Since the second sealing resin 14 has high liquidity when uncured, the electronic module 100 enables the spaces between the electrodes 12 of the second electronic component 11 having narrow pitches to be sufficiently filled with the second sealing resin 14 and prevents a gap from being provided therein.

The electronic module 100 having the above structure according to the first preferred embodiment may be manufactured by, for example, a method described below. In actual manufacturing processes, a large number of the electronic modules 100 are collectively manufactured in a manner in which a mother substrate is divided into the individual electronic modules during the processes. In the following description, however, the single electronic module 100 is manufactured for convenience of description.

Figure 2A:
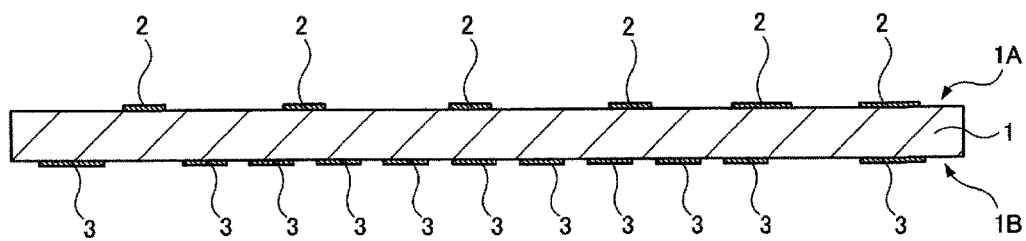
FIGS. 2A to 2C illustrate processes that are performed in an example of a method of manufacturing the electronic module with sectional views.

As illustrated in FIG. 2A, the substrate 1 is prepared. In the substrate 1, the electrodes 2 are formed on the first main surface 1A, the electrodes 3 are formed on the second main surface 1B, and inner wiring (not illustrated) connecting the electrodes 2 and the electrodes 3 to each other is installed in advance.

Figure 2B:
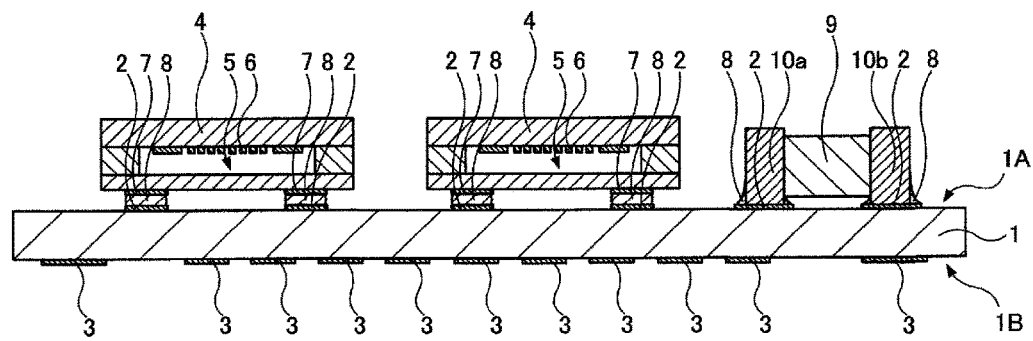

Subsequently, as illustrated in FIG. 2B, the first electronic components 4 and the second electronic component 9 are mounted on the electrodes 2 on the first main surface 1A of the substrate 1. Specifically, a solder paste is first applied to the electrodes 2. Subsequently, the electrodes 7 of the first electronic components 4 and the electrodes 10a and 10b of the second electronic component 9 are disposed to the electrodes 2 to which the solder paste is applied. Subsequently, the solder paste is melted by being heated, and cooled to form the solder 8, and the electrodes 7 of the first electronic components 4 and the electrodes 10a and 10b of the second electronic component 9 are joined to the electrodes 2 that are formed on the first main surface 1A of the substrate 1.

Figure 2C:
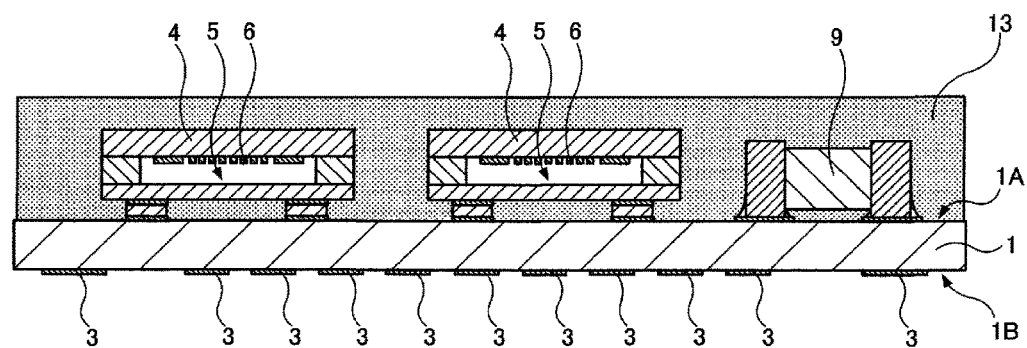

Subsequently, as illustrated in FIG. 2C, the first electronic components 4 and the second electronic component 9 that are mounted on the first main surface 1A of the substrate 1 are sealed with the first sealing resin 13. Specifically, a space around the first electronic components 4 and the second electronic component 9 is first filled with the first sealing resin 13 that is uncured. Subsequently, the first sealing resin 13 is cured by being heated, irradiated with light, or heated and irradiated with light. Since the first sealing resin 13 has low liquidity when uncured, the hollow portion 5 of each first electronic component 4 is not crushed due to the pressure when the first sealing resin 13 is filled.

Figure 3D:
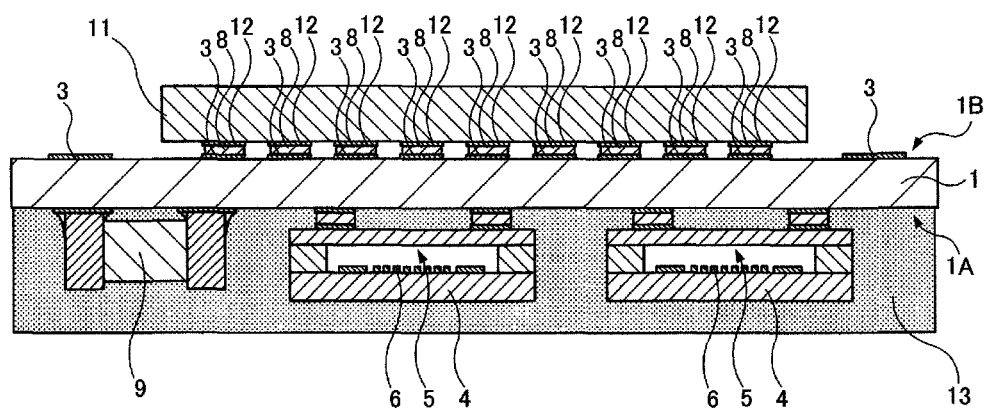
FIGS. 3D to 3F illustrate processes subsequent to that in FIG. 2C that are performed in the example of the method of manufacturing the electronic module with sectional views.

Subsequently, as illustrated in FIG. 3D, the second electronic component 11 is mounted on the corresponding electrodes 3 on the second main surface 1B of the substrate 1. Specifically, the substrate 1 is first turned upside down. Subsequently, a solder paste is applied to the electrodes 3 on which the second electronic component 11 is to be mounted. Subsequently, the electrodes 12 of the second electronic component 11 are disposed on the electrodes 3 to which the solder paste is applied. Subsequently, the solder paste is melted by being heated and cooled to form the solder 8, and the electrodes 12 of the second electronic component 11 are joined to the electrodes 3 that are formed on the second main surface 1B of the substrate 1.

Figure 3E:
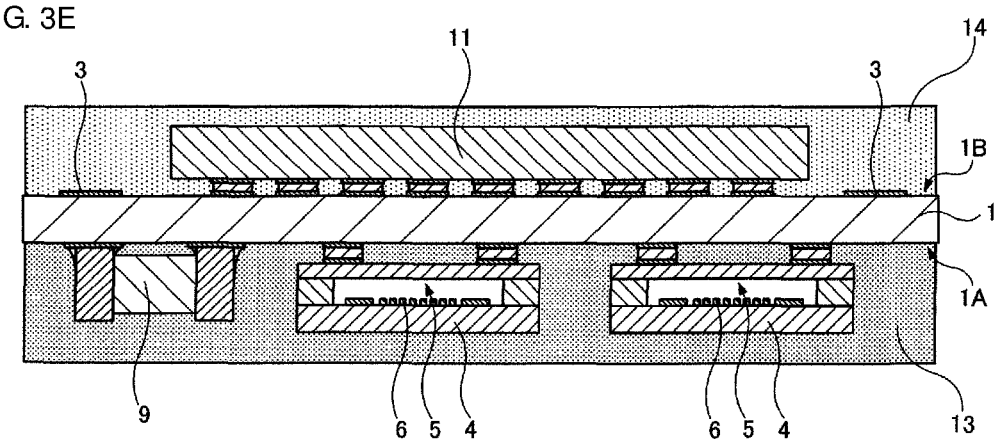

Subsequently, as illustrated in FIG. 3E, the second electronic component 11 that is mounted on the second main surface 1B of the substrate 1 is sealed with the second sealing resin 14. Specifically, a space around the second electronic component 11 is first filled with the second sealing resin 14 that is uncured. Subsequently, the second sealing resin 14 is cured by being heated, irradiated with light, or heated and irradiated with light. Since the second sealing resin 14 has high liquidity when uncured, the spaces between the electrodes 12 of the second electronic component 11 having narrow pitches are sufficiently filled with the second sealing resin 14, and no gap is formed therein.

Figure 3F:
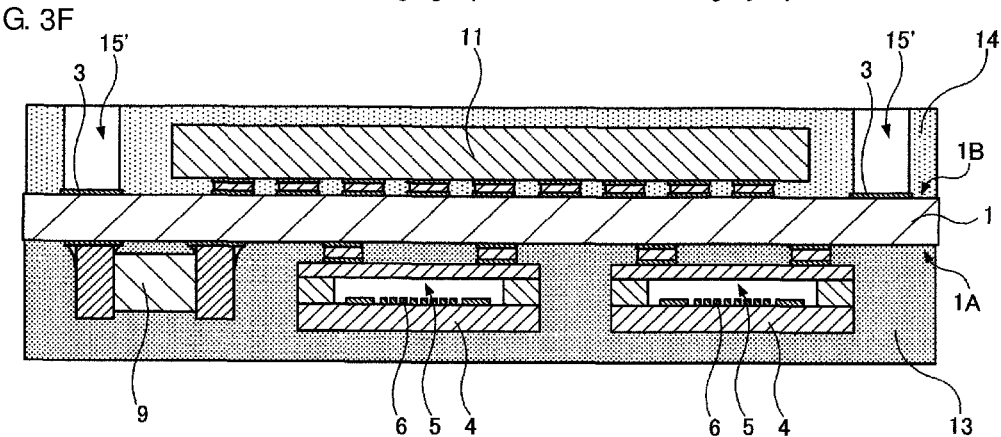

Subsequently, as illustrated in FIG. 3F, holes 15' for forming the via electrodes 15 are formed in the second sealing resin 14 by, for example, laser radiation. The holes 15' are formed such that the bottom extends to the electrodes 3 on the second main surface 1B of the substrate 1. The holes 15' may be formed by cutting with a drill, instead of the laser radiation.

Figure 4G:
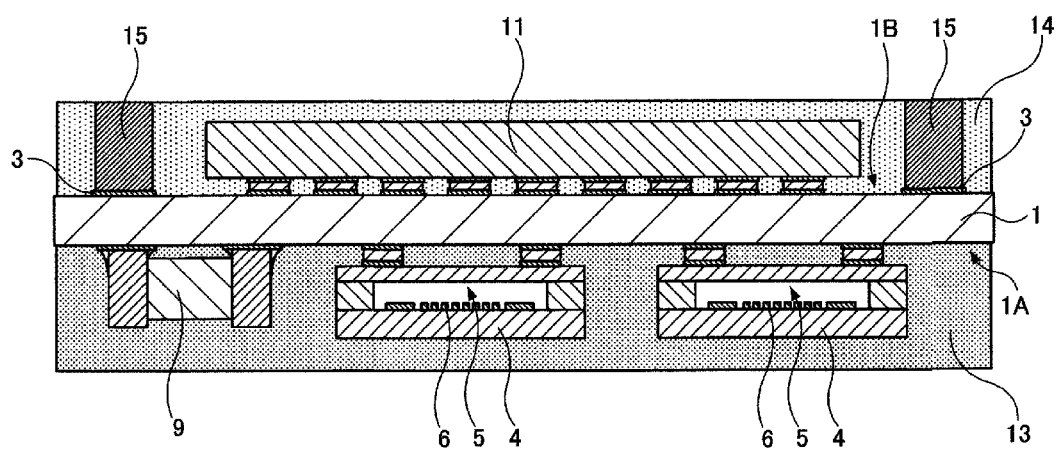
FIGS. 4G and 4H illustrate processes subsequent to that in FIG. 3F that are performed in the example of the method of manufacturing the electronic module with sectional views.

Subsequently, as illustrated in FIG. 4G, a metal is precipitated by plating on and over the electrodes 3 that are formed on the second main surface 1B of the substrate 1 and that are exposed to the bottom of the holes 15' to form the via electrodes 15.

Figure 4H:
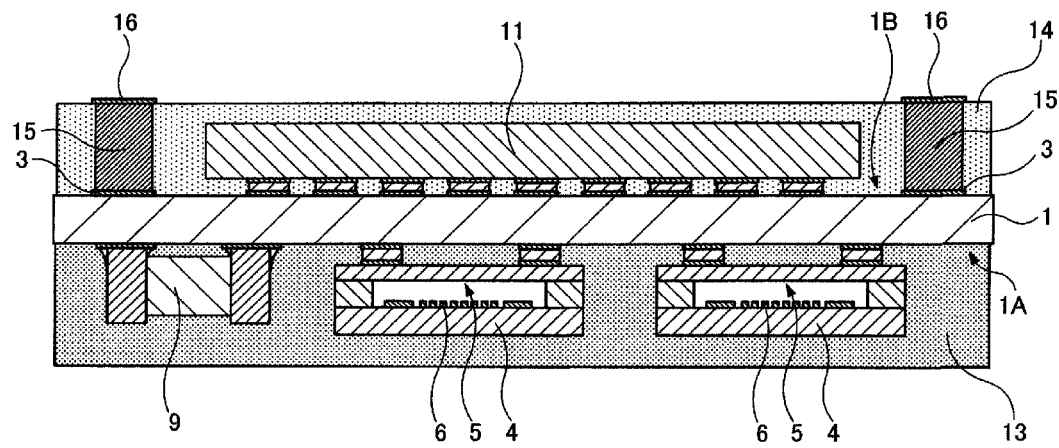

Finally, as illustrated in FIG. 4H, the via electrodes 15 that are exposed from the outer surface of the second sealing resin 14 are plated to form the outer electrodes 16 to complete the electronic module 100.

The second sealing resin 14 of the electronic module 100 is preferably the epoxy resin, as the base material, that includes powder of silica having an average particle diameter of about 30 µm in an amount of about 50% by volume as the filler, for example.

In an electronic module according to a first modification of the first preferred embodiment, the type of the base material of the second sealing resin 14, the material of the filler, and the volume percentage of the filler are not changed, and only the average particle diameter of the filler is changed from about 30 µm to about 10 µm, for example.

The first sealing resin 13 is not changed and is the epoxy resin, as the base material, that includes powder of silica having an average particle diameter of about 30 µm in an amount of about 80% by volume as the filler, for example.

Since the average particle diameter of the filler that is included in the second sealing resin 14 of the electronic module according to the first modification is decreased from about 30 µm to about 10 µm, the liquidity of the second sealing resin 14 that is uncured is increased. In the electronic module according to the first modification, the second sealing resin 14 that is uncured has increased liquidity, and the spaces between the electrodes 12 of the second electronic component 11 having narrow pitches are filled with the second sealing resin 14 with certainty, and a gap is less likely to be formed therein.

The average particle diameter of the filler that is included in the second sealing resin 14 of the electronic module according to the first modification is decreased from about 30 µm to about 10 µm, for example.

In an electronic module according to a second modification of the first preferred embodiment, the second sealing resin 14 preferably includes no filler and is a fillerless resin.

Since the second sealing resin 14 of the electronic module according to the second modification is the fillerless resin, the liquidity of the second sealing resin 14 that is uncured is further increased. Accordingly, the spaces between the electrodes 12 of the second electronic component 11 having narrow pitches are filled with the second sealing resin 14 with more certainty, and a gap is less likely to be formed therein.

Second Preferred Embodiment

Figure 5:
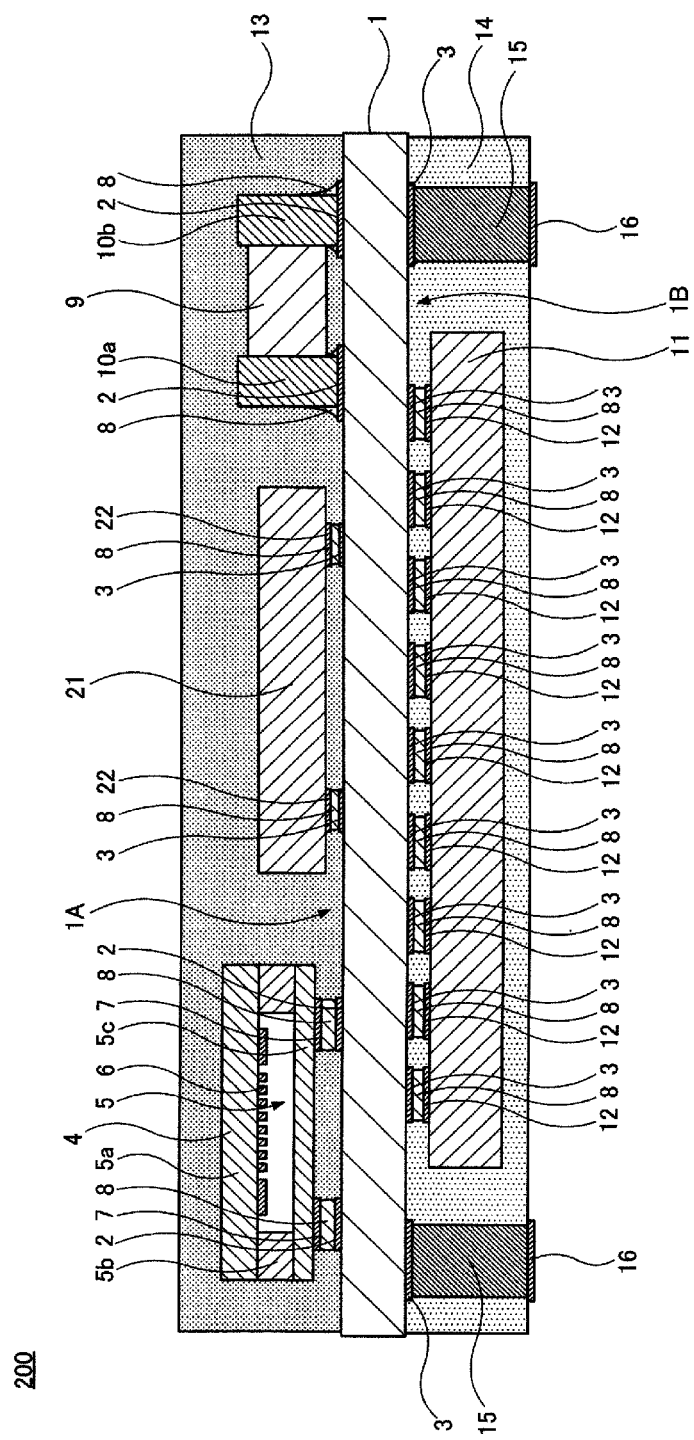
FIG. 5 is a sectional view of an electronic module according to a second preferred embodiment of the present invention.

FIG. 5 illustrates an electronic module 200 according to a second preferred embodiment of the present invention. FIG. 5 is a sectional view of the electronic module 200.

The electronic module 200 includes a modification to the electronic module 100 according to the first preferred embodiment. Specifically, the electronic module 200 includes a second electronic component 21 substituted for one of the first electronic components 4, although, in the electronic module 100, the two first electronic components 4 each of which includes the hollow portion 5 and the second electronic component 9 that includes no hollow portion are mounted on the first main surface 1A of the substrate 1. The second electronic component 21, together with the first electronic component 4 and the second electronic component 9, is sealed with the first sealing resin 13.

The second electronic component 21 is preferably a semiconductor device, for example, and electrodes 22 are provided on the mounting surface as with the second electronic component 11. However, the pitch between the electrodes 22 that are provided on the mounting surface of the second electronic component 21 is wider than those in the second electronic component 11 and are preferably, for example, about 0.3 mm.

Even when the first sealing resin 13 that has low liquidity when uncured seals the second electronic component 21, the space between the electrodes 22 is sufficiently filled with the first sealing resin 13, and no gap is provided therein because the pitch between the electrodes 22 that are provided on the mounting surface is relatively wide.

The first sealing resin 13 that has low liquidity when uncured is able to seal the second electronic component that is mounted on the first main surface 1A of the substrate 1 provided that the pitch between the electrodes 22 that are provided on the mounting surface is sufficiently wide as with the second electronic component 21.

Third Preferred Embodiment

Figure 6:
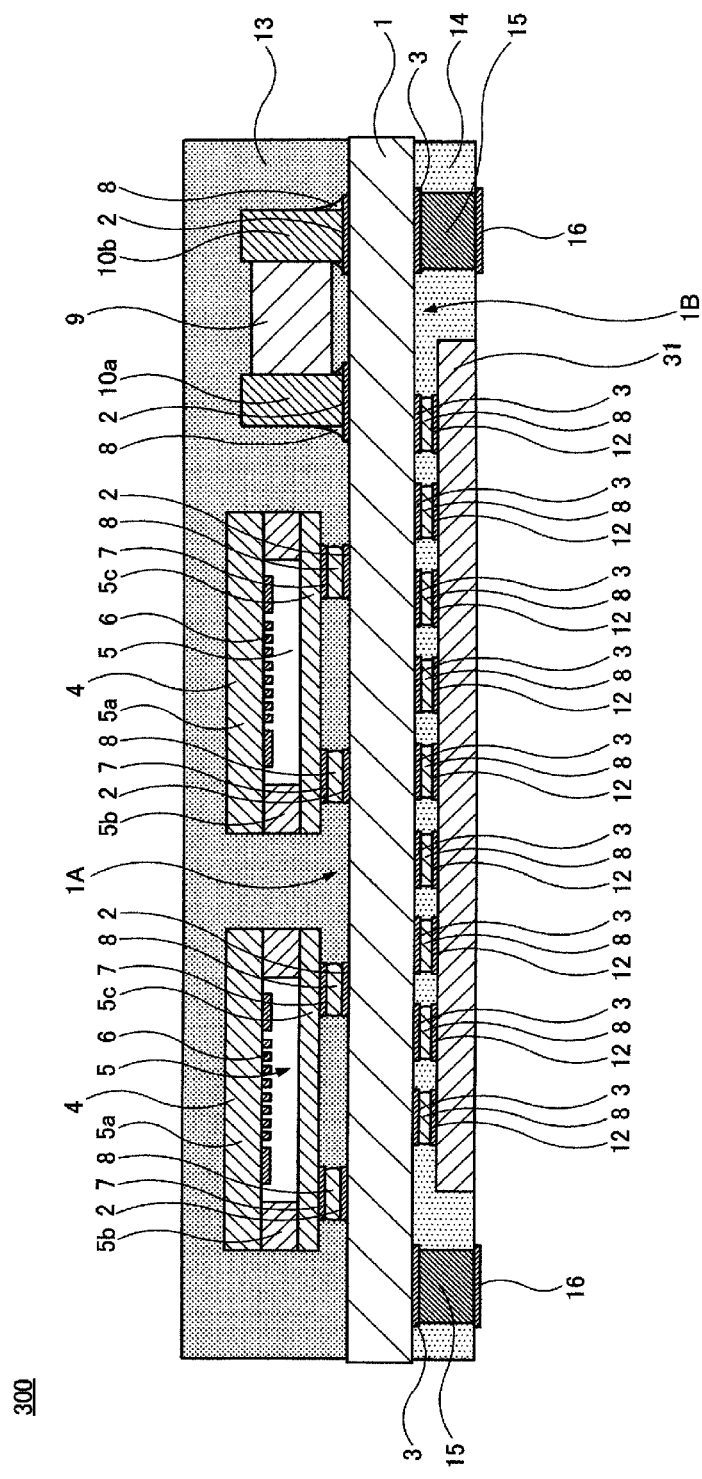
FIG. 6 is a sectional view of an electronic module according to a third preferred embodiment of the present invention

FIG. 6 illustrates an electronic module 300 according to a third preferred embodiment of the present invention. FIG. 6 is a sectional view of the electronic module 300.

The electronic module 300 includes a modification to the electronic module 100 according to the first preferred embodiment. The modification will be specifically described below. Of the second electronic components, each of which includes no hollow portion in the electronic module 100, the second electronic component 11 that has the narrowest pitch between the electrodes that are provided on the mounting surface is completely sealed with the second sealing resin 14. That is, all surfaces of the second electronic component 11 including the mounting surface, the surface opposite the mounting surface, and the side surfaces are covered by the second sealing resin 14. This is modified in the electronic module 300. Of the second electronic components, a second electronic component 31 that has the narrowest pitch between the electrodes that are provided on the mounting surface includes a surface that is exposed from the outer surface of the second sealing resin 14 to the outside. The thickness of the second electronic component 31 of the electronic module 300 is less than that of the second electronic component 11 of the electronic module 100.

Since the surface of the second electronic component 31 is exposed from the outer surface of the second sealing resin 14 to the outside, the thickness of the second sealing resin 14 is decreased. Accordingly, the height of the electronic module 300 is decreased. The height is also decreased due to a decrease in the thickness of the second electronic component 31.

Fourth Preferred Embodiment

Figure 7:
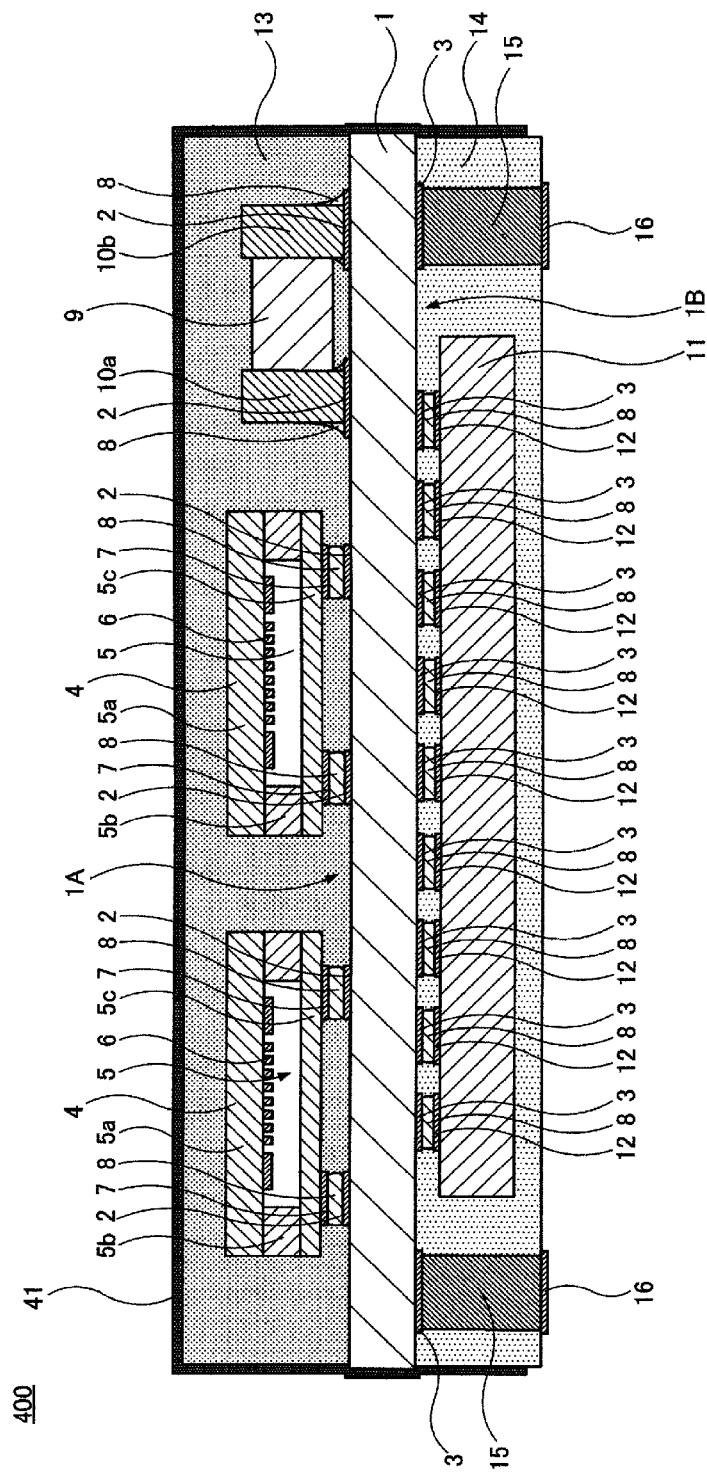
FIG. 7 is a sectional view of an electronic module according to a fourth preferred embodiment of the present invention

FIG. 7 illustrates an electronic module 400 according to a fourth preferred embodiment of the present invention. FIG. 7 is a sectional view of the electronic module 400.

The electronic module 400 differs from the electronic module 100 according to the first preferred embodiment by including an additional structure. Specifically, the electronic module 400 includes a shield electrode 41 that is provided on the upper surface and four side surfaces of the electronic module 100. More specifically, the shield electrode 41 is provided on all outer surfaces of the first sealing resin 13, four edge surfaces of the substrate 1, and portions of outer surfaces of the second sealing resin 14. The material and structure of the shield electrode 41 are not limited. For example, the shield electrode 41 may preferably have a three-layer structure including a close-contact layer that is made of Ti, Ni, Cr, or SUS, or an alloy thereof, a conductive layer that is made of Cu, Al, or Ag, or an alloy thereof, and a corrosion resistance layer that is made of Ti, Ni, or Cr, or an alloy thereof.

The shield electrode 41 of the electronic module 400 prevents noise from entering the inside from the outside and prevents a noise from being emitted from the inside to the outside. The shield electrode 41 of the electronic module 400 also prevents water from entering the inside, and accordingly, the humidity resistance is improved.

Fifth Preferred Embodiment

Figure 8:
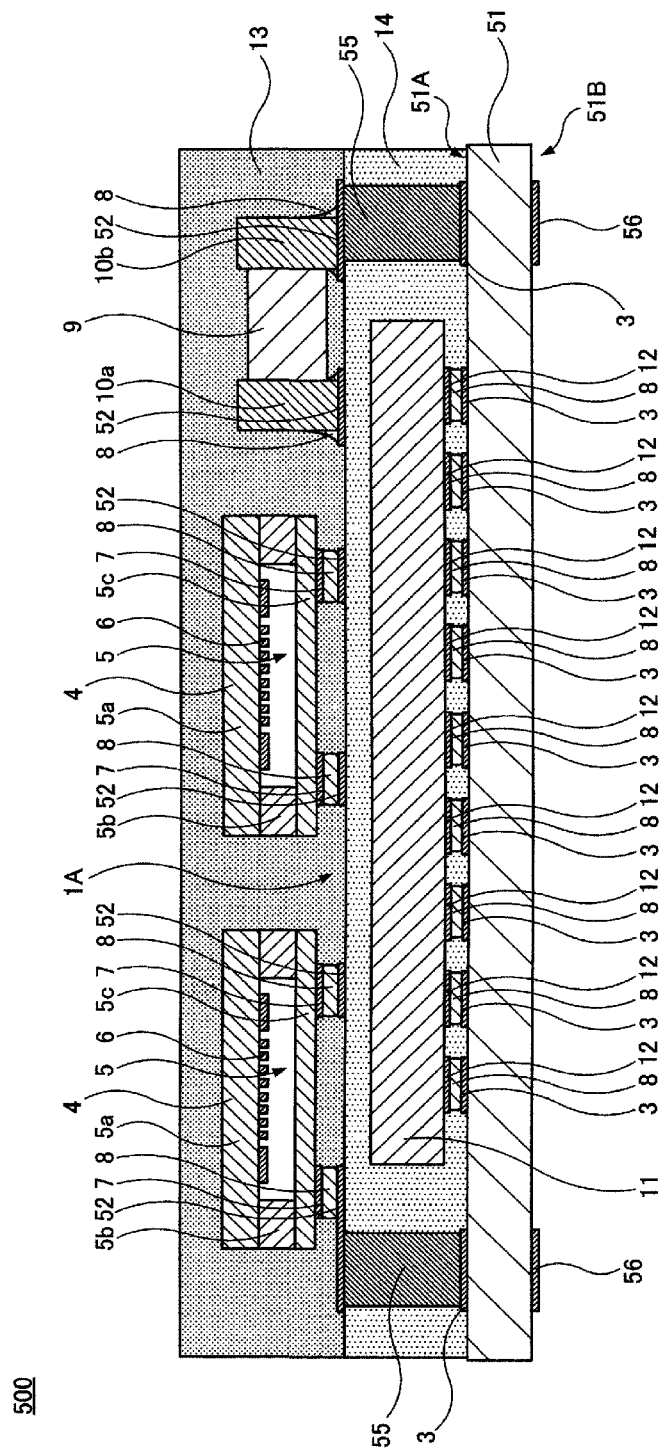
FIG. 8 is a sectional view of an electronic module according to a fifth preferred embodiment of the present invention
Figure 9:
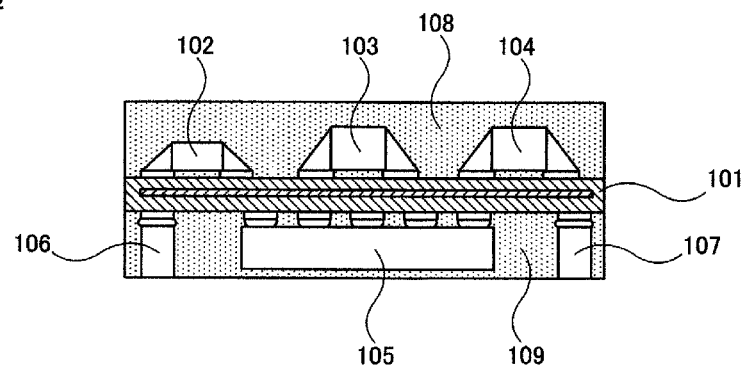
FIG. 9 is a sectional view of an electronic module that is disclosed in WO2014/017159A1.
Figure 10:
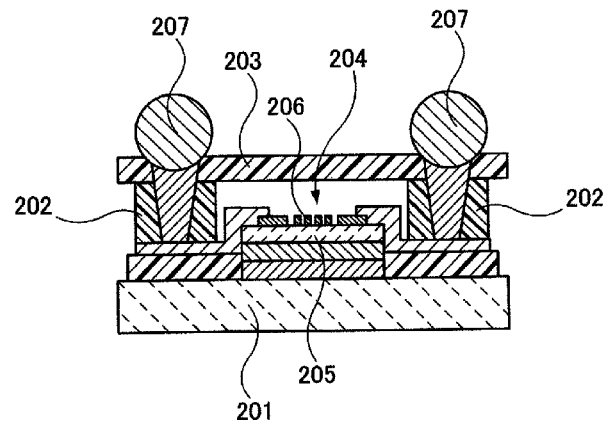
FIG. 10 is a sectional view of an elastic wave device that is disclosed in WO2015/098678A1.

FIG. 8 illustrates an electronic module 500 according to a fifth preferred embodiment of the present invention. FIG. 8 is a sectional view of the electronic module 500.

In the electronic modules 100, 200, 300, and 400 according to the first preferred embodiment to the fourth preferred embodiment, the first sealing resin 13 is provided on the first main surface 1A of the substrate 1, and the second sealing resin 14 is provided on the second main surface 1B of the substrate 1. This is modified in the electronic module 500. The second sealing resin 14 is provided on a first main surface 51A of a substrate 51, the first sealing resin 13 is provided on the second sealing resin 14. This will be simply described below.

The electronic module 500 includes the substrate 51. The electrodes 3 are provided on the first main surface 51A of the substrate 51. Outer electrodes 56 are provided on a second main surface 51B of the substrate 51 and are used when the electronic module 500 is mounted.

Of the second electronic components, each of which includes no hollow portion, the second electronic component (semiconductor device) 11 that has the narrowest pitch between the electrodes that are provided on the mounting surface is mounted on the first main surface 51A of the substrate 51.

The second electronic component 11 is sealed with the second sealing resin 14. The second sealing resin 14 of the electronic module 500 is preferably the epoxy resin, as the base material, that includes powder of silica having an average particle diameter of about 30 μm in an amount of about 50% by volume, for example, as the filler as with the electronic module 100. The second sealing resin 14 has high liquidity when uncured because of a small amount of the included filler.

Via electrodes 55 extend through the second sealing resin 14. Each via electrode 55 is connected at one end to the corresponding electrode 3 that is provided on the first main surface 51A of the substrate 51. The other end of each via electrode 55 is exposed from the outer surface of the second sealing resin 14.

Electrodes 52 are provided on the second sealing resin 14. The other end of each via electrode 55 that is exposed from the outer surface of the second sealing resin 14 is connected to the corresponding electrode 52.

The two first electronic components (elastic wave devices) 4 each of which includes the hollow portion 5 and the second electronic component 9 defined by chip components are mounted on the electrodes 52 that are provided on the second sealing resin 14.

The first electronic components 4 and the second electronic component 9 are sealed with the first sealing resin 13. The first sealing resin 13 of the electronic module 500 is preferably the epoxy resin, as the base material, that includes powder of silica having an average particle diameter of about 30 μm in an amount of about 80% by volume, for example, as the filler as with the electronic module 100. The first sealing resin 13 has high humidity resistance and low liquidity when uncured because of a large amount of the included filler.

The above-described example of the method of manufacturing the electronic module 100 may be applied to manufacture the electronic module 500. Specifically, the second electronic component 11 is first mounted on the substrate 51. Subsequently, the second electronic component 11 is sealed with the second sealing resin 14. Subsequently, the via electrodes 55 are formed in the second sealing resin 14. Subsequently, the electrodes 52 are formed on the second sealing resin 14. Subsequently, the first electronic components 4 and the second electronic component 9 are mounted on the electrodes 52. Finally, the first electronic components 4 and the second electronic component 9 are sealed with the first sealing resin 13 to complete the electronic module 500.

The electronic module 500 enables the spaces between the electrodes 12 of the second electronic component 11 having narrow pitches to be sufficiently filled with the second sealing resin 14 and prevents a gap from being formed therein because the second sealing resin 14 has high liquidity when uncured. In addition, the electronic module 500 prevents the hollow portion 5 of each first electronic component 4 from being crushed due to the pressure when the first sealing resin 13 is filled because the first sealing resin 13 has low liquidity when uncured. In addition, the electronic module 500 prevents water from entering the hollow portion 5 of each first electronic component 4 because the first sealing resin 13 has high humidity resistance.

The electronic modules 100, 200, 300, 400, and 500 according to the first preferred embodiment to the fifth preferred embodiment are described above. The present invention, however, is not limited to the above-described preferred embodiments, and various modifications may be made within the concept of the invention.

For example, the type of the resin base material is not limited, and a silicone resin, for example, may be used instead of an epoxy resin, although epoxy resins are preferably used as the base materials of the first sealing resins 13 and the second sealing resins 14 of the electronic modules 100, 200, 300, 400, and 500. The type of each base material may differ between the first sealing resin 13 and the second sealing resin 14.

The material of the filler is not limited, and alumina, boron nitride, or a composite material thereof, for example, may be used instead of silica, although powder of silica is preferably used as the fillers of the first sealing resins 13 and the second sealing resins 14 of the electronic modules 100, 200, 300, 400, and 500. The material of each filler may differ between the first sealing resin 13 and the second sealing resin 14.

The type of each first electronic component 4 is not limited, and another type of the first electronic component may be used instead of an elastic wave device, although elastic wave devices are preferably used as the first electronic components 4, each of which includes the hollow portion 5, of the electronic modules 100, 200, 300, 400, and 500.

The type of the second electronic component 11 is not limited, and another kind of the second electronic component may be used instead of a semiconductor device, although semiconductor devices are preferably used as the second electronic components 11, each of which has no hollow portion, of the electronic modules 100, 200, 300, 400, and 500.

The via electrodes 15 and 55 of the electronic modules 100, 200, 300, 400, and 500 are preferably provided in the second sealing resin 14 in a manner in which the metal is precipitated by electroplating. Alternatively, the via electrodes 15 and 55 may be provided in the second sealing resin 14 in a manner in which a pin metal terminal is embedded.

In the electronic module 500, the second sealing resin 14 is provided on the first main surface 51A of the substrate 51, and the first sealing resin 13 is provided on the second sealing resin 14. However, the positional relationship may be changed such that the first sealing resin 13 is provided on the first main surface 51A of the substrate 51, and the second sealing resin 14 is provided on the first sealing resin 13.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic module comprising:
   a substrate;
   at least one first electronic component that includes electrodes provided on a mounting surface thereof on the substrate and that includes a hollow portion;
   at least one second electronic component that includes electrodes provided on a mounting surface thereof on the substrate and that includes no hollow portion;
   a first sealing resin; and
   a second sealing resin; wherein
   the at least one first electronic component is sealed with the first sealing resin;
   the at least one second electronic component has a narrowest pitch between the electrodes that are provided on the mounting surface, and at least the mounting surface including the electrodes of the at least one second electronic component are sealed with the second sealing resin; and
   a volume percentage of a filler that is included in the first sealing resin is larger than a volume percentage of a filler that is included in the second sealing resin.

2. The electronic module according to claim 1, wherein humidity resistance of the first sealing resin is higher than humidity resistance of the second sealing resin.

3. The electronic module according to claim 1, wherein the first sealing resin is provided on one main surface of the substrate; and
   the second sealing resin is provided on the other main surface of the substrate.

4. The electronic module according to claim 1, wherein the first sealing resin and the second sealing resin are stacked on one main surface of the substrate.

5. The electronic module according to claim 1, wherein the at least one first electronic component is an elastic wave device.

6. The electronic module according to claim 1, wherein the at least one second electronic component that has the narrowest pitch between the electrodes on the mounting surface is a semiconductor device.

7. The electronic module according to claim 1, further comprising:
   a mounting outer electrode provided on an outer surface of the second sealing resin.

8. The electronic module according to claim 1, wherein a shield electrode is provided on at least a portion of an outer surface of the first sealing resin and an outer surface of the second sealing resin.

9. An electronic module comprising:
   a substrate;
   at least one first electronic component that includes electrodes provided on a mounting surface thereof on the substrate and that includes a hollow portion;
   at least one second electronic component that includes electrodes provided on a mounting surface thereof on the substrate and that includes no hollow portion;
   a first sealing resin; and
   a second sealing resin; wherein
   the at least one first electronic component is sealed with the first sealing resin;
   the at least one second electronic component has a narrowest pitch between the electrodes that are provided on the mounting surface, and at least the mounting surface including the electrodes of the at least one second electronic component are sealed with the second sealing resin; and
   an average particle diameter of a filler that is included in the first sealing resin is larger than an average particle diameter of a filler that is included in the second sealing resin.

10. The electronic module according to claim 9, wherein humidity resistance of the first sealing resin is higher than humidity resistance of the second sealing resin.

11. The electronic module according to claim 9, wherein the first sealing resin is provided on one main surface of the substrate; and
    the second sealing resin is provided on the other main surface of the substrate.

12. The electronic module according to claim 9, wherein the first sealing resin and the second sealing resin are stacked on one main surface of the substrate.

13. The electronic module according to claim 9, wherein the at least one first electronic component is an elastic wave device.

14. The electronic module according to claim 9, wherein the at least one second electronic component that has the narrowest pitch between the electrodes on the mounting surface is a semiconductor device.

15. The electronic module according to claim 9, further comprising:
   a mounting outer electrode; wherein
      the mounting outer electrode is provided on an outer surface of the second sealing resin.

16. The electronic module according to claim 9, wherein a shield electrode is provided on at least a portion of an outer surface of the first sealing resin and an outer surface of the second sealing resin.

* * * * *